(12) United States Patent
Nagashima (10) Patent No.: US 6,304,208 B1
(45) Date of Patent: Oct. 16, 2001

(54) SUCCESSIVE APPROXIMATION ANALOG-TO-DIGITAL CONVERTER CIRCUIT

(75) Inventor: Yoshikazu Nagashima, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/487,179

(22) Filed: Jan. 19, 2000

(30) Foreign Application Priority Data

Jan. 19, 1999 (JP) .................................................. 11-010678

(51) Int. Cl.$^7$ ................................................ H03M 1/00
(52) U.S. Cl. ............................................. 341/172; 341/163
(58) Field of Search .................................. 341/118, 120, 341/161–163, 172

(56) References Cited

U.S. PATENT DOCUMENTS 5,471,208 * 11/1995 Sauer ..................................... 341/120
6,100,837 * 8/2000 Takeuchi ............................. 341/161

FOREIGN PATENT DOCUMENTS 5-110436   4/1993 (JP) .
5-114462   5/1993 (JP) .
5-160729   6/1993 (JP) .

* cited by examiner

Primary Examiner—Howard L. Williams
(74) Attorney, Agent, or Firm—Oblon, Spivak, McClelland, Maier & Neustadt, P.C.

(57) ABSTRACT

There is provided a successive approximation A/D converter circuit for correcting an error generated in an A/D conversion code due to parasitic resistance of a D/A conversion circuit, on a semiconductor chip. A switch for performing a switching operation between a sampling period and a comparing period, and first and second level shift circuits constituted of a plurality of condensers, are provided between a D/A conversion circuit and a voltage comparing circuit. The first level shift circuit applies a voltage for correcting a voltage drop due to the parasitic resistance of the D/A conversion circuit to the plurality of condensers to evenly correct the errors generated in the D/A conversion voltage independently of the D/A conversion code. The second level shift circuit applies a voltage for correcting a voltage drop due to the parasitic resistance of the D/A conversion circuit to the plurality of condensers to perform an offset full-scale correction for correcting the errors generated in the D/A conversion voltage per bit of the D/A conversion code in a successive comparing process. It is possible to correct the error generated in the A/D conversion code on the semiconductor chip by combining the offset correction using the first and second level shift circuits and the offset full-scale correction.

12 Claims, 5 Drawing Sheets

SUCCESSIVE APPROXIMATION ANALOG-TO-DIGITAL CONVERTER CIRCUIT

BACKGROUND OF THE INVENTION

The present invention relates to an analog-to-digital converter circuit capable to being included in a semiconductor integrate circuit. More specifically, the present invention relates to a successive approximation mation analog-to-digital converter circuit capable being operated at a high speed with high accuracy.

The successive approximation analog-to-digital converter circuit conventionally used has a digital-to-analog conversion circuit, which is formed of a resistor string in which a plurality of resistors are connected in series, as a reference voltage generation circuit. Hereinafter, the resistor string will be referred to as "resistor circuit" and the digital-to-analog conversion to "D/A conversion".

In this case, if a parasitic resistance is present at electrode portions of both ends of the resistor circuit, the parasitic resistance has an effect upon the voltage between intermediate terminals of the resistor circuit, in other words, a reference voltage generated at both ends of a unit resistor constituting the resistor circuit, with the result that the resultant voltage is smaller than normally obtained. Therefore, the D/A conversion code converted from an analogous input voltage by using the D/A conversion circuit includes an error corresponding to a voltage drop due to the parasitic resistance.

To avoid the decrease in conversion accuracy due to the parasitic resistance, it may be considered that the resistance of the resistor circuit constituting the D/A conversion circuit is increased. However, the high resistance is a big drawback to attaining the high speed conversion. Alternatively, it may be considered that resistances of unit resistors corresponding to the most significant and least significant sides of the resistor circuit are lowered in consideration of the parasitic resistance. However, since the resistances vary depending upon variation of process conditions, it is extremely difficult to set the resistances accurately.

Now, referring to FIG. 1, problems of the conventionally-used D/A conversion circuit will be explained in detail.

Figure 1:
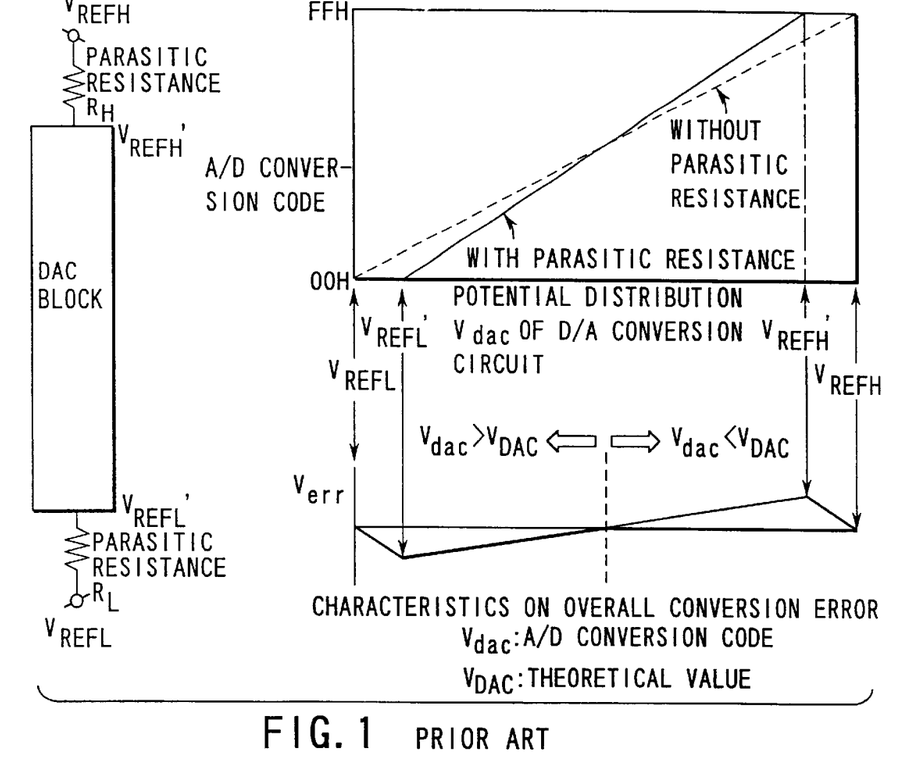
FIG. 1 is a view showing an influence of an error by a parasitic resistance included in a conventional D/A conversion circuit.

The DAC block shown in the leftmost column of FIG. 1 indicates a resistor circuit constituted of a plurality of unit resistors connected in series. The DAC block is a main constitutional element of the D/A conversion circuit generating a reference voltage for determining the D/A conversion code.

However, in practice, parasitic resistances $R_L$, $R_H$ are present respectively between the DAC block and each of two end terminals of the DAC block, one for applying a reference voltage (generating a reference voltage) $V_{REFL}$ at a low voltage side and the other for applying a reference voltage $V_{REFH}$ at a high voltage side.

FIG. 1 (at the upper right portion) schematically shows the relationship between the potential distribution $V_{dac}$ of the D/A conversion circuit (mainly composed of the DAC block having parasitic resistances at both ends) and the A/D conversion code determined by using the potential distribution. Note that "00H" and "FFH" plotted on the longitudinal axis are the A/D conversion code in terms of hexadecimal notation. A broken line indicates the case where the parasitic resistances $R_L$, $R_H$ are absent. The solid line corresponds to the case where the parasitic resistances are present.

As shown in the graph, when the parasitic resistances are absent, a simple proportional relationship is established between the potential distribution $V_{dac}$ and the A/D conversion code. Whereas, when the parasitic resistances are present, a voltage drop due to the presence of the parasitic resistances $R_L$, $R_H$ has an effect upon both ends of the potential distribution. Since the A/D conversion code is determined based upon the potential distribution, an error is included. Since the graph is drawn assuming that $R_L$ is equal to $R_H$, an error is not presented in the middle of the graph. However, since $R_L$ is not equal to $R_H$ in practice, the solid line shown in the graph is evenly (equally) deviated from the broken line (hereinafter, referred to "off-set error").

If a product obtained by multiplying a theoretical value of the A/D conversion code obtained on the basis of the case without the parasitic resistance by a voltage of the least significant bit, is represented by $V_{DAC}$, an analogous input voltage input into the analog-to-digital circuit is represented by $V_{AIN}$, and an overall conversion error is represented by $V_{err}=V_{dac}-V_{AIN}$, $V_{dac}>V_{DAC}$ at the low voltage side, and $V_{dac}<V_{DAC}$ at the high voltage side are obtained as shown in FIG. 1, at a lower right side. To obtain a correct code, $V_{dac}$ must be reduced at the low voltage side of the DAC block and $V_{dac}$ must be increased at the high voltage side.

Figure 2:
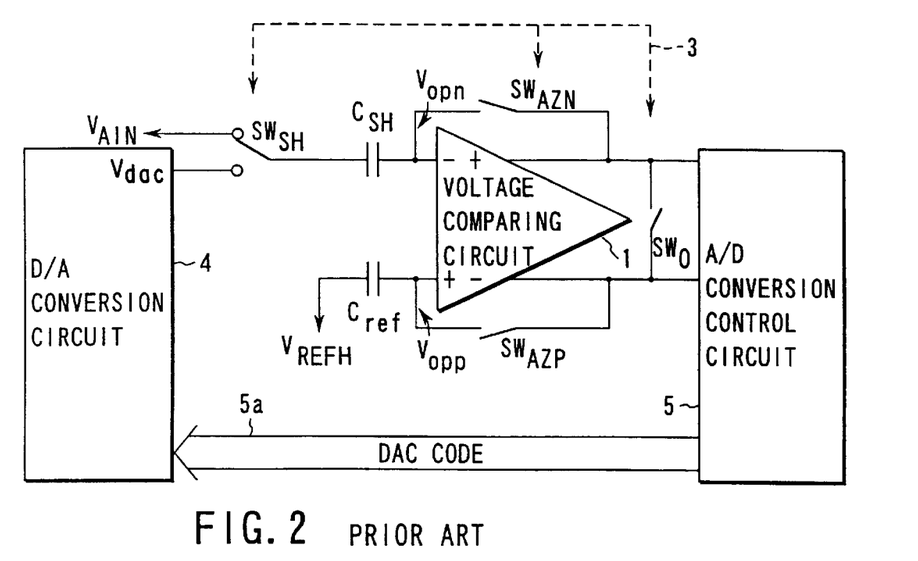
FIG. 2 is a circuit diagram showing an arrangement of a conventional successive approximation A/D converter circuit.

Referring now to FIG. 2, operation of the successive approximation A/D converter circuit conventionally used will be schematically explained. The successive approximation A/D converter circuit shown in FIG. 2 is constituted of a voltage comparing circuit 1, a D/A conversion circuit 4, and an A/D conversion control circuit 5.

To the successive approximation A/D converter circuit, an analogous input voltage $V_{AIN}$ is input. The D/A conversion circuit 4 outputs the voltage $V_{dac}$ D/A-converted from the DAC block. The voltage comparing circuit 1 compares the analogous input voltage $V_{AIN}$ with the D/A converted voltage $V_{dac}$. The A/D conversion control circuit 5 has a register circuit for determining and holding a predetermined data corresponding to one-bit of the D/A conversion code depending upon the output from the voltage comparing circuit 1.

The A/D conversion control circuit 5 repeats the comparing/determining operation per bit from the most significant bit (MSB) to the least significant bit (LSB) of the D/A conversion code. The D/A conversion code finally determined, in other words, a DAC code 5a shown in FIG. 2, is output to the D/A conversion circuit 4. In this manner, the D/A conversion code is held in a register circuit as an A/D conversion data.

To explain more specifically, the successive approximation A/D converter circuit comprises a sample-hold condenser $C_{SH}$ connected to one of input terminals of the voltage comparing circuit 1, a reference condenser $C_{ref}$ connected to the other input terminal of the voltage comparing circuit 1, a switch $SW_{SH}$ connected to one of the terminals of the sample-hold condenser $C_{SH}$, for switching the analogous input voltage $V_{AIN}$ and the D/A converted voltage $V_{dac}$ from each other, and switches $SW_{AZN}$, $SW_0$, $SW_{AZP}$ directly connected to the sample-hold condenser $C_{SH}$ and the reference condenser $C_{ref}$ by bypassing the voltage comparing circuit 1. The switches $SW_{AZN}$, $SW_0$, $SW_{AZP}$ are simultaneously turned on during a sample-hold period.

An arrow of the broken line 3 indicates that a plurality of switches are operated in connection with each other between the sample-hold period and the period (hereinafter, referred to as "comparing period") in which $V_{AIN}$ and $V_{dac}$ are compared with each other in the voltage comparing circuit 1, as in the aforementioned manner.

In the sample-hold period, the switch $SW_{SH}$ is connected to a $V_{AIN}$ side. Simultaneously, the switches $SW_{AZN}$, $SW_0$, $SW_{AZP}$ are turned on and $C_{SH}$, and $C_{ref}$ are connected in series. As a result, the $C_{SH}$, and $C_{ref}$ are rapidly charged with a potential difference between $V_{AIN}$ and $V_{REFH}$.

When the sample-hold operation by the sample-hold condenser $C_{SH}$ is completed, the switches $SW_{AZN}$, $SW_0$, $SW_{AZP}$ are turned off, whereby the bypass of the voltage comparing circuit 1 is opened and the voltage comparing circuit 1 becomes active. As a result, voltage $V_{opn}$ and $V_{opp}$ ($V_{opn}$) obtained before the opening are maintained at the differential input.

More specifically, the sample-hold voltage of the analogous input voltage $V_{AIN}$ is transferred to + input voltage $V_{opp}$ of the voltage comparing circuit 1 by the switching operation, and maintained by $C_{ref}$ over the comparing periods sequentially performed from MSB to LSB.

During the comparing period, the switch $SW_{SH}$ is connected to the $V_{dac}$ side. In a first comparing operation, $V_{dac}$ corresponding to the most significant D/A conversion code is output to the D/A conversion circuit 4. $V_{dac}$ is compared with the analogous input voltage $V_{AIN}$ for magnitude by the voltage comparing circuit 1. If $V_{dac} > V_{AIN}$, the MSB of the corresponding D/A conversion code is determined as "0". IF $V_{dac} < V_{AIN}$, the MSB of the D/A conversion code is determined as "1". The comparison is repeated in the same manner until LSB of the A/D conversion code of $V_{AIN}$ is determined. As a result, the conversion codes of the overall bits providing $V_{AIN}$ are determined.

Next, we will explain the successive comparing process from a first MSB until n-th LSB is determined, by taking an n-bit (n is an integer of 1 or more) successive approximation A/D converter circuit conventionally used, as an example. In addition, we will explain why an error is generated between $V_{DAC}$ (a theoretical value of the A/D conversion code) and $V_{dac}$ (obtained in practice) if parasitic resistances $R_H$, $R_L$ are included in the D/A conversion circuit.

In the first-time comparing operation, if a voltage of a (−) input terminal of the voltage comparing circuit 1 is $V_{opn}$, a voltage of a (+) input terminal of the voltage comparing circuit 1 is $V_{opp}(=V_{opn})$, and the electric charge to be supplied to a condenser $C_{SH}$ is $Q_{total}$, then a charge equation is given by $$Q_{total} = C_{SH}(V_{opn} - V_{AIN}) \quad (1).$$

Furthermore, if the output from the D/A conversion circuit 4 in i-th (i is an integer of 1 or more) process of the successive comparing process is $V_{dac}(i)$, an input voltage to a (−) side of the voltage comparing circuit 1 is $V_{opn}'(i)$, and electric charge of $C_{SH}$ is $Q_{total}'$, then, a charge equation is given by $$Q_{total}' = C_{SH}\{V_{opn}'(i) - V_{dac}(i)\} \quad (2).$$

In the circuit shown in FIG. 2, if $V_{AIN} > V_{dac}(i)$, $V_{opn}(= V_{opp}) > V_{opn}'(i)$. Therefore, the i-th D/A conversion code determined in the i-th time comparison becomes "1".

On the other hand, if $V_{AIN} < V_{dac}(i)$, $V_{opn}(= V_{opp}) < V_{opn}'(i)$. Therefore, the i-th D/A conversion code determined in the i-th time comparison becomes "0".

Since the D/A conversion code is converted to satisfy $V_{opn}(=V_{opp})=V_{opn}'(i)$ in accordance with the aforementioned procedure in the successive conversion, $V_{dac}(i)$ output from the D/A conversion circuit 4 is approximated to $V_{AIN}$. The charge held by the sample-hold condenser $C_{SH}$ can be maintain during all periods including the sampling period and comparing period ($Q_{total} = Q_{total}'$). The D/A conversion voltage $V_{dac}(n)$ at the time the A/D conversion of the analogous input voltage $V_{AIN}$ is completed, is given by the following equations (1) and (2):

$$C_{SH}\{V_{opn} - V_{opn}'(n) - V_{AIN} + V_{dac}(n)\} = 0 \quad (3).$$

In this case, if $V_{opn} = V_{opn}'(n)$, then, the following equation is given:

$$V_{dac}(n) = V_{AIN}(=V_{DAC} - \Delta V) \quad (4).$$

In other words, if the D/A conversion code is obtained by using the conventional D/A conversion circuit 4 including the parasitic resistances $R_L$, $R_H$, the output $V_{dac}(n)$ of the D/A conversion circuit 4 approximates to the analogous input voltage $V_{AIN}$. However, in the case, the error ($\Delta V$) explained by use of the rightward figure of FIG. 1 remains between $V_{dac}(n)$ and the theoretical value $V_{DAC}$. Therefore, it is impossible that the analogous input voltage $V_{AIN}$ is consistent with the D/A conversion voltage $V_{DAC}$ corresponding to the A/D conversion code theoretically obtained.

The conventional successive converter circuit has the resistor circuit in which a plurality of resistor circuits connected in series, as a constitutional element of the D/A conversion circuit. However, when the resistor circuit has parasitic resistance at both ends, an error is inevitably produced in the A/D converter circuit to be output.

BRIEF SUMMARY OF THE INVENTION

The present invention is made to solve the aforementioned problems. An object of the present invention is to provide a successive approximation A/D converter circuit for providing an accurate A/D conversion code by applying a correction voltage from a D/A conversion circuit to the input of a voltage comparing circuit in a comparing period, even if the resistance circuit has a parasitic resistance at both ends.

The successive approximation converter A/D circuit of the present invention has a plurality of condenser circuits between the D/A conversion circuit and the voltage comparing circuit, and has a level shift circuit for applying a voltage for compensating a voltage drop due to the parasitic resistance to the plurality of condensers. Therefore, it is possible to attain a highly-accurate successive approximation A/D converter circuit while the A/D conversion error due to the parasitic resistance is suppressed.

To be more specific, a plurality of voltages are selected from the D/A conversion circuits and applied to a first level shift circuit for performing an offset correction and applied to a second level shift circuit for performing an offset full-scale correction, whereby it is possible to obtain a successive approximation A/D conversion circuit having an ideal D/A conversion circuit virtually containing no parasitic resistance, by compensating a change in reference voltage of the D/A conversion circuit due to parasitic resistance.

The offset correction used herein is made so as to enhance an inversion symmetry of characteristics on overall conversion error by adding a level shift evenly (equally) over entire characteristics shown in FIG. 1. In other words, the D/A conversion voltages are corrected evenly (equally) independently of the A/D conversion code.

Furthermore, the offset full-scale correction made by further minimizing the error characteristics rising rightward which has been improved in inversion symmetry by the aforementioned offset correction. In other words, the D/A conversion voltage is corrected per bit of the A/D conversion code. Due to the two-step correction of error characteristics, the correction process can be more regulated, with the result that the correction circuit can be constituted more simply.

More specifically, according to the present invention, there is provided a successive approximation A/D converter circuit comprising:

a resistor circuit consisting of a plurality of unit resistances connected in series;

a D/A conversion circuit for outputting a D/A converted voltage from a D/A conversion code and a plurality of voltages divided by the resistor circuit, by using first and second reference voltages applied to two ends of the resistor circuit;

a voltage comparing circuit for comparing the D/A conversion voltage and an analogous input voltage:

data determining means for determining a predetermined data corresponding to one bit of the D/A conversion code in accordance with output from the voltage comparing circuit;

an A/D conversion control circuit for repeatedly applying the data determination means to each bit of the D/A conversion code from MSB to LSB and outputting the D/A conversion code finally determined to the D/A conversion circuit, and holding the D/A conversion code as A/D conversion data;

a level shift circuit for shifting a comparing voltage of the voltage comparing circuit independently of the D/A conversion code by using the first and second voltages selected from the plurality of voltages.

The successive approximation A/D converter circuit of the present invention is characterized by further comprising a second level shift circuit for selecting a plurality of third voltages in accordance with the D/A conversion code from the plurality of voltages and selecting a plurality of fourth voltages in couple with the plurality of third voltages, and shifting a comparing voltage of the voltage comparing circuit in accordance with the D/A conversion code by using the plurality of third and fourth voltages.

The level shift circuit preferably comprises at least one of offset correction condensers; and voltage switching means for switching first and second voltages between a sampling period and a comparing period and applying the first voltage or the second voltage to one of terminals of the at least one of offset correction condensers, the other terminal of the at least one of offset correction condensers being connected to one of input terminals of the voltage comparing circuit.

Furthermore, the level shift circuit preferably comprises a first switch one of terminals of which is connected to an intermediate terminal of an end of the resistance circuit;

a plurality of second switches connected to the corresponding intermediate terminals of the resistance circuit by way of one of terminals of each of the second switches;

a common line to which the other terminals of the plurality of second switches are commonly connected;

a third switch one of terminals of which is connected the common line;

an output node to which the other terminal of each of the first and third switches is connected;

at least one of offset correction condensers to which one of terminals of the output node is connected;

first switching control means for selectively turning on one of the plurality of second switches; and a second switching control means for exclusively turning on or off the first and third switches by using a signal which exhibits a high level only in the sample period, as one of signals, in which other terminal of the at least one of offset correction condensers is connected to one of input terminals of the voltage comparing circuit; and a voltage of the intermediate terminal of an end of the resistance circuit (designated as a first voltage) and a voltage of any one of intermediate terminals (designated as a second voltage) are switched between the sampling period and the comparing period by the first and second switching control means, and output to the output node, whereby an offset correction level shift voltage is input into one of input terminals of the voltage comparing circuit through the at least one of offset correction condensers.

Furthermore, the level shift circuit preferably comprises:

at least one of first offset correction condensers;

at least one of second offset correction condensers; and voltage switching means for switching first and second voltages between the sampling period and the comparing period and applying the first and second voltage to one of terminals of each of the first and second offset correction condensers, in which the other terminals of the first and second offset correction condensers are connected to two input terminals of the voltage comparing circuit, respectively.

Furthermore, the level shift circuit preferably comprises:

a first switch one of terminals of which is connected to an intermediate terminal of an end terminal of the resistance circuit;

a plurality of second switches connected to the corresponding intermediate terminals of the resistance circuit by way of one of terminals of each of the second switches;

a common line to which the other terminals of the plurality of second switches are commonly connected;

a third switch one of terminals of which is connected the common line;

a fourth switch one of terminals of which is connected to the common line;

a fifth switch one of terminals of which is connected to the intermediate terminal of an end of the resistance circuit;

a first output node to which the other terminals of the first and fourth switches are connected;

at least one of first offset correction condensers one of terminals of which is connected to the first output node;

a second output node to which the other terminals of the third and fifth switches are connected;

at least one of second offset correction condensers one of terminals of which is connected to the second output node;

a first switching control means for selectively turning on one of the plurality of second switches; and a second switching control means for exclusively turning on or off the first and fourth switches and third and fifth switches by using a signal which exhibits a high level only in the sample period, as one of signals, in which the other terminal of the at least one of first offset correction condensers is connected to one of input terminals of the voltage comparing circuit;

the other terminal of the at least one second offset correction condensers is connected to the other input terminal of the voltage comparing circuit;

a voltage of the intermediate terminal of an end of the resistance circuit (designated as a first voltage) and a voltage of any one of intermediate terminals (designated as a second voltage) are switched between the sampling period and the comparing period by the first and second switching control means, and output to the first and second output nodes, whereby offset correction level shift voltages are input into one of input terminals of the voltage comparing circuit through the at least one of first and second offset correction condensers.

Furthermore, the second level shift circuit preferably comprises:

a plurality of offset full-scale correction condensers; and voltage switching means for switching a plurality of third and fourth voltages both being coupled with each other between the sampling period and the comparing period and applying one of the plurality of third and fourth voltages to the corresponding offset full-scale correction condensers through one of terminals thereof, in which the other terminals of the plurality of offset full-scale correction condensers are commonly connected to one of input terminals of the comparing circuit.

Furthermore, the second level shift circuit preferably comprises:

a selector for selecting a plurality of first intermediate terminals and a plurality of intermediate terminals coupled with the plurality of first intermediate terminals in accordance with the D/A conversion code from the plurality of intermediate terminals of the resistance circuit;

a plurality of three-terminal switches two input terminals of which are connected to a plurality of first and second intermediate terminals; and a plurality of offset full-scale correction condenser connected to the corresponding output terminals of the plurality of three-terminal switches, in which the three terminal switch switches voltages of the two input terminals between the sampling period and the comparing period, and applies the voltages to one of terminals of the offset full-scale correction condenser.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained with reference to the accompanying drawings. First, referring to FIG. 3, the successive approximation A/D converter circuit according to a first embodiment of the present invention will be explained.

Figure 3:
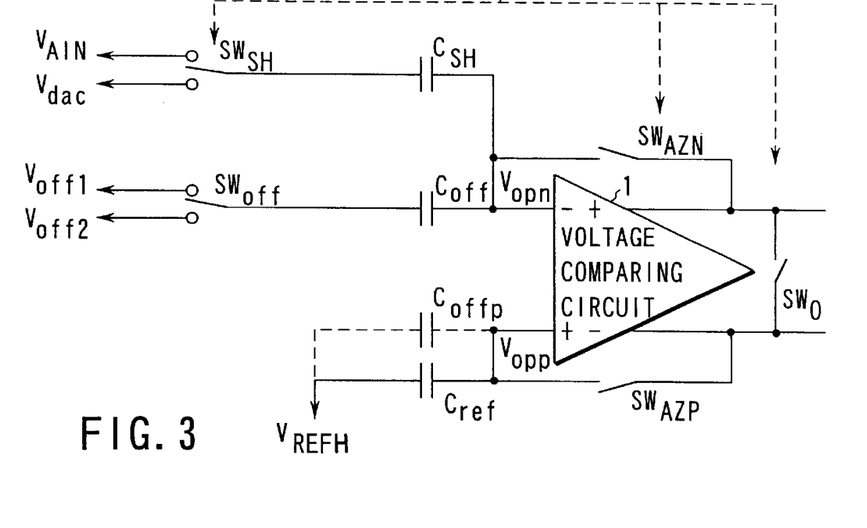
FIG. 3 is a circuit diagram showing a schematic operation of a correction circuit according to a first embodiment.

FIG. 3 shows the successive approximation A/D converter circuit according to the first embodiment having a voltage comparing circuit 1 of the present invention and a circuit diagram of the input region. In the first embodiment, the D/A conversion circuit 4 and the A/D conversion control circuit 5 are employed as is the same as in FIG. 2. However, they are omitted for brevity.

In the first embodiment, an off set correction condenser $C_{off}$ is added in parallel to a sample-hold condenser $C_{SH}$. Different voltages are applied to the sampling period and the comparing period to correct the D/A conversion voltage $V_{dac}$ by $\Delta V$ in such a way that the analogous input voltage $V_{AIN}$ is consistent with the D/A conversion voltage $V_{DAC}$ which corresponds to A/D conversion code of the theoretically obtained $V_{AIN}$.

It is therefore possible to correct the offset error evenly (equally) contained in the overall D/A conversion voltages from MSB to LSB by relatively shifting by $+\Delta V$ or $-\Delta V$. In this way, the offset correction is attained.

Referring to FIG. 3, we will explain the offset correction of the successive approximation A/D converter circuit according to the first embodiment, more specifically. In the sampling period, the switch $SW_{SH}$ is connected to a side of an analogous input voltage $V_{AIN}$. Simultaneously, the switch $SW_{off}$ is connected to a terminal voltage $V_{off1}$ at a lower voltage side of the resistor circuit constituting the D/A conversion circuit.

As described in FIG. 2, in the sampling period, the switches $SW_{AZN}$, $SW_{AZP}$, $SW_0$ are turned on. As a result, a (−) input terminal and (+) output terminal, (+) input terminal and (−) output terminal, and (+) output terminal and (−) output terminal are individually connected to form a bypass circuit in the voltage comparing circuit 1.

In this case, if the voltage of the (−) input terminal is $V_{opn}(=V_{opp}$: voltage of the (+) input terminal), then, a charge equation of the electric charge $Q_{total}$ to be supplied to the sample-hold condenser $C_{SH}$ and to the offset correction condenser $C_{off}$ is given by $$Q_{total}=C_{SH}(V_{opn}-V_{AIN})+C_{off}(V_{opn}-V_{off1}) \qquad (5)$$

Subsequently, in the comparing period, when the switches $SW_{AZN}$, $SW_{AZP}$, $SW_0$ are turned off, the bypass circuit of the voltage comparing circuit 1 is opened, with the result that the voltage comparing circuit 1 is activated. At this time, the sample-hold voltage $V_{opn}$ of the (−) input terminal of the voltage comparing circuit 1 is transferred as the voltage $V_{OPP}$ of the (+) input terminal and held by the reference condenser $C_{ref}$.

Next, we will explain the offset correction condenser $C_{offp}$ of the (+) input terminal indicated by a broken line in FIG. 3. The offset correction condenser $C_{offp}$ is not required when the offset correction is made by using the offset correction condenser $C_{off}$ of the (−) input terminal described below. However, in the correction process, correction voltage is not always applied to the (−) input terminal of the voltage comparing circuit 1 through the condenser or may be applied to the (+) input terminal. The same effect can be obtained if a differential-type correction voltage is applied to the (−) input terminal and (+) input terminal.

The (−) input terminal or (+) input terminal is selected depending upon an entire circuit arrangement, and matching characteristics, as well as shape and size of the overall conversion error characteristics shown at the right lower portion of FIG. 1. In particular, in the offset correction in which correction is usually made in a large amount, it is necessary to increase freedom of design. It is therefore desirable to set the offset correction condenser $C_{offp}$ not only at the (−) input terminal but also at the (+) input terminal. In FIG. 3, a broken line indicates a case where $C_{offp}$ is provided so as to apply the differential correction voltage to the voltage comparing circuit.

As shown in FIG. 3, when the offset correction condenser $C_{off}$ of the (−) input terminal is used, the (+) input terminal $C_{offp}$ plays a role in holding the voltage $V_{opp}$ of the (+) input terminal, in the same way as the reference condenser $C_{ref}$.

Then, switch $SW_{SH}$ is connected to an output voltage $V_{dac}$ side of the D/A conversion circuit and simultaneously the switch $SW_{off}$ is connected to $V_{off2}$, thereby initiating a comparing operation for determining MSB. $V_{off2}$ used herein is one of intermediate terminal voltages of the resistor circuit constituting the D/A conversion circuit. The comparing operation is successively repeated n-times from the determination of MSB to LSB. In this manner, the A/D conversion codes corresponding to all bits can be obtained.

At this time, the charge equation at an i-th time of successive comparing process, is given by $$Q_{total}'=C_{SH}(V_{opn}'(i)-V_{dac}(i))+C_{off}(V_{opn}'(i)-V_{off2}) \quad (6).$$

The same abbreviations are used for expressing the same items employed in equations (2) and (5), and therefore the detailed explanation is omitted. Since the amounts of electric charges held by the condensers $C_{SH}$, $C_{off}$ are maintained as described above, if equation (5)—equation (6) is performed in connection with equation (4) under condition of $V_{opn} = V_{opn}'$ after the n-th comparing operation, and assuming that and i=n, the error between $V_{dac}$ (n) and the theoretical value $V_{DAC}$, is $\Delta V$, then, the conditions for making the input voltage $V_{AIN}$ consistent with the theoretical D/A conversion voltage $V_{DAC}$, is given by $$\Delta V = (C_{off}/C_{SH}) \cdot (V_{off1}-V_{off2}) = K_{off}\Delta V_{off} \quad (7).$$

where $K_{off}(=C_{off}/C_{SH})$ is a capacitance coupling ratio, and $\Delta V_{off} (V_{off1}-V_{off2})$ is a difference in voltage applied to $C_{off}$ during the sample period and the comparing period.

As described above, if a correction voltage $\Delta V_{off}$ is applied to the offset correction condenser $C_{off}$, it is possible to add the same correction $\Delta V$ to the D/A conversion voltage $V_{dac}$ during the comparing operation for determining all A/D conversion codes from MSB to LSB. At this time, the magnitude $\Delta V_{off}$ suitable for providing a desired correction amount must be set in accordance with the parasitic resistance of the A/D converter circuit.

In the first embodiment, it is not necessary to limit the offset correction condenser to one. If m number (m is an integer of 1 or more) of offset correction condensers are provided in the A/D converter circuit, and m number of differences in correction voltage are employed, then, the equation (7) can be rewritten as follows:

$$\Delta V = \sum_{j=1}^{m} (C_{offj}/C_{SH}) \cdot (V_{off1j}-V_{off2j}) = \sum_{j=1}^{m} K_{offj} \cdot \Delta V_{offj}. \quad (8)$$

If a plurality of offset correction condensers $C_{offj}$ (j=1−m) different in capacitance are used as mentioned above, it is possible to arbitrarily change not only the magnitude of $\Delta V_{offj}$ but also the capacitance coupling ratio. Therefore, the offset correction can be made further accurately and widely.

The entire conversion errors can be relatively shifted by $+\Delta V$ (or $-\Delta V$) in the offset correction explained in the first embodiment. The correction is not made per bit of the D/A conversion code.

On the other hand, in the offset full-scale correction which will be explained later in the second and third embodiments, correction is made per bit of the D/A conversion code. However, if the offset correction according to the first embodiment is performed before the offset full-scale correction, a displacement of the center point of characteristics on overall conversion error which plays a main role in determining the MSB code in FIG. 1, is corrected, with the result that the MSB conversion can be made accurately.

Furthermore, if the displacement of the center point is corrected, an inversion symmetry of the overall conversion error characteristics is increased. As a result, absolute values of the conversion errors to the A/D conversion code at a distance of $|\Delta V_{AIN}|$ from $(V_{REFH}+V_{REFL})/2$, become equal. This method is therefore advantageous since a circuit arrangement for implementing the offset full-scale correction can be greatly simplified.

Figure 4:
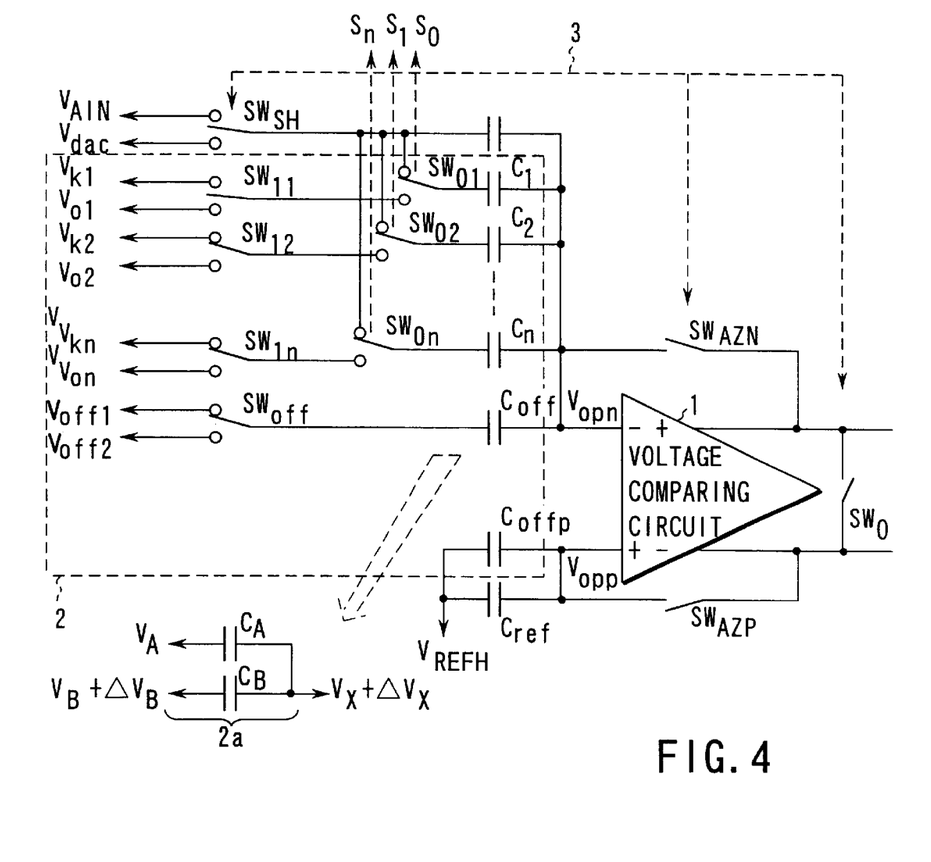
FIG. 4 is a circuit diagram showing a schematic operation of a correction circuit according to a second embodiment.

Now, referring to FIG. 4, we will explain operation of the successive approximation A/D converter circuit having the offset full-scale correction function according to a second embodiment of the present invention.

In FIG. 4, a partial circuit 2 of the present invention (surrounded by a broken line) comprises a plurality of condensers $C_1$ to $C_n$, $C_{off}$ and $C_{offp}$, a plurality of voltage pairs $V_{k1}/V_{01}$, $V_{kn}/V_{0n}$ to be applied to a plurality of condensers $C_1$ to $C_n$ by switching between the sampling period and the comparing period by a plurality of switches $SW_{11}$ to $SW_{1n}$, $SW_{off}$, and a plurality of switches $SW_{11}$ to $SW_{1n}$; and voltages $V_{off1}$, $V_{off2}$ to be applied to the condenser $C_{off}$ by switching between the sampling period and the comparing period by the switch $SW_{off}$.

The partial circuit 2 of the present invention further comprises switches $SW_{01}$ to $SW_{0n}$ for switching the connection of the plurality of condensers $C_1$ to $C_n$ from with a plurality of voltage pairs $V_{k1}/V_{01}$- $K_{kn}/K_{0n}$ to with $C_{SH}$. Furthermore, a partial circuit 2a indicated by a thick brokenline arrow shows an operational principal of a plurality of condensers mentioned above. The arrangement of the other parts of FIG. 4 are similar to that of the conventional approximation A/D converter circuit shown in FIG. 2, and therefore, the detail explanation of them will be omitted.

In the second embodiment, the D/A conversion circuit 4 and the A/D conversion control circuit 5 shown in FIG. 2 are used in the same manner as in FIG. 2. In addition, the DAC code 5a can be transferred in the same manner. However, these elements are omitted in FIG. 4 for brevity's sake.

In the successive approximation A/D converter circuit according to the second embodiment, the offset correction as described in the first embodiment can be made. Therefore, the offset correction condenser $C_{off}$, is further connected other than the offset full-scale correction condensers $C_1$ to $C_n$ in the partial circuit 2.

In the successive approximation A/D converter circuit of the second embodiment, it is possible to perform the offset correction by the offset correction condenser $C_{off}$ and further to correct conversion error remaining on the D/A conversion code (indicated as a rightwardly rising line in the overall conversion error characteristic graph in FIG. 1).

In the second embodiment, a plurality of offset full-scale correction condensers $C_1$ to $C_n$ are provided other than the offset correction condenser $C_{off}$. In the sampling period, each of a plurality of voltages $V_{k1}$ to $V_{kn}$ selected in accordance with the D/A conversion codes from the D/A conversion circuit is applied to one of the terminals of the corresponding offset full-scale correction condensers $C_1$ to $C_n$. In the comparing period, each of a plurality of voltages $V_{01}$ to $V_{0n}$ (paired with the $V_{k1}$ to $V_{kn}$ respectively) which are selected from the D/A conversion circuit in accordance with the D/A conversion code is applied to one of the terminals of the corresponding offset full-scale correction condensers $C_1$ to $C_n$.

In this way, between the sampling period and a k-th time period (k is an integer of 1 or more) in the successive comparing process performed every conversion code, a plurality of voltage pairs ($V_{k1}/V_{01}$ to $V_{kn}/V_{0n}$) are switched with each other and applied to one of the terminals of the corresponding condensers $C_1$ to $C_n$.

In this case, if $V_{kj}-V_{0j}=\Delta V_{kj}$ (j=1–n), then $V_{kj}$ (during the sample period), and $V_{kj}+\Delta V_{kj}$ (during the comparing period) are applied to one of the terminals of each of the condensers $C_1$ to $C_n$.

In the case of the offset correction mentioned previously, if $V_{off1}-V_{off2}=\Delta V_{off1}$, $V_{off1}$ (during the sample period) and $V_{off1}+\Delta V_{off1}$ (during the comparing period) are applied to one of the terminals of each of the offset correction condensers $C_{off}$. Note that in the case of the offset correction, correction is made evenly (equally) independent of the bit of the conversion code. Therefore, all values of $\Delta V_{off1}$ are the same during the k-times comparing periods.

Thus, the correction method of the D/A conversion code of the present invention will be generally explained by use of the partial circuit 2a shown in FIG. 4. For example, of a plurality of condensers shown in FIG. 4, it is assumed that a sample hold condenser $C_{SH}$ is $C_A$, a voltage $V_{dac}$ to be applied to $C_{SH}$ during the comparing period is $V_A$, any one of the offset correction condenser $C_{off}$ and a plurality of offset full-scale correction condensers $C_1$–$C_n$ is $C_B$, and further $C_A$ is connected to $C_B$, as is shown in the partial circuit 2a.

Furthermore, a voltage $V_B$ (during the sampling period) and a voltage $V_B+\Delta V_B$ (during the comparing period) are assumed to be applied to the terminal at the input side of $C_B$. Then, a voltage $V_x$ obtained through capacitance division of $V_A$ and $V_B$ is applied to output nodes of the condensers $C_A$ and $C_B$. At this time, if input voltage $V_B$ changes by $\Delta V_B$ between the sampling period and the comparing period, the voltage $V_x$ of the output node is shifted by $\Delta V_x$. It is possible to correct the error included in $V_x$ (i.e., $V_A$) by using the shift amount $\Delta V_x$.

In this case, if the capacitance coupling ratio is K, $K=C_B/C_A$. If a voltage change of the output node is $\Delta V_x$, $\Delta V_x=K\cdot\Delta V_B$. As shown in the partial circuit 2 in connection with the present invention, in the case where a plurality of condensers $C_C$, $C_D$, $C_E$ . . . are used simultaneously in addition to $C_B$, $C_A+C_C+C_D+C_E$ . . . may be applied in place of $C_A$ in the equation of the capacitance coupling ratio: $K=C_B/C_A$. Then, the contribution of $\Delta V_B$ with respect to $\Delta V_x$ is obtained, and then, the contribution of $\Delta V_C$, $\Delta V_D$, $\Delta V_E$ . . . with respect to $\Delta V_x$ is obtained. Then, both $\Delta V_x$ values may be added.

To be more specific, the correction amount to the input voltage $V_{opn}$ which is one of the input voltages of the voltage comparing circuit 1 during the comparing period, may be obtained by adding $\Delta V_{off1}$ selected from the D/A conversion circuit independently of a type of the conversion code, or by adding a change amount of $\Delta V_{opn}$ by $\Delta V_{kj}$ (j=1–n) selected depending upon a type of the conversion code.

As described above, in the K-th step of the successive approximation process, a plurality of pair voltages ($V_{k1}/V_{01}$) –($V_{kn}/V_{0n}$) are selected in accordance with the D/A conversion codes and applied to the plurality of offset full-scale correction condensers $C_1$ to $C_n$, respectively between the sample period and the comparing period. It is therefore possible to shift the correction voltage $V_{opn}$ every k-th bit of the D/A conversion code to thereby allow the analogous input voltage $V_{AIN}$ to be in consistent with the D/A conversion voltage $V_{DAC}$ of the A/D conversion code theoretically obtained.

The conversion error $V_{err}$ after the offset correction is made, can be expressed as a function of $V_{AIN}$.

$$V_{err}=\{2V_{ERR}/(V_{REFH}-V_{REFL})\}\times\{V_{AIN}-(V_{REFH}+V_{REFL})/2\} \quad (9)$$

where $2V_{ERR}/(V_{REFH}-V_{REFL})$ indicates an inclination of the line of the conversion error rising rightward in the overall conversion error characteristics of FIG. 1 and $V_{AIN}-(V_{REFH}+V_{REFL})/2$ shows a displacement from a center in potential distribution of the D/A conversion circuit.

As described before, the conversion error $V_{err}$ is corrected by connecting a plurality of offset full-scale correction condensers $C_j$(j=1–n) to one of the voltage comparing circuit 1 and providing differences ($V_{kj}-V_{0j}$) (j=1–n) in voltage selected by the D/A conversion code in each step of the successive comparing circuit to a plurality of offset full-scale correct condensers $C_j$(j=1–n), respectively.

If the same procedure is repeated as in deducing equations (7) and (8), the voltage shift amount $\Delta V_{kin}$ for correcting a D/A conversion voltage $V_{dac}$ during k-th-time comparing period from the determination of MSB will be given by the following equation:

$$\Delta V_{kin} = \sum_{i=1}^{n} Ci(Vki-V0i) \Big/ \left(Ctotal - \sum_{j=1}^{n} Cj\delta ij\right) \quad (10)$$

where $V_{kj}$ is a voltage to be applied to the condenser $C_j$ in the k-th comparing period. $V_{0j}$ is a voltage to be applied to the condenser $C_j$ during a first comparing period from the sampling period until the MSB is determined. $\delta_{ij}$ is 1 if i=j, and 0 if i≠j. $C_{total}$ is given by the following equation:

$$C_{total} = C_{SH} + C_{off} + \sum_{j=1}^{n} Cj. \tag{11}$$

As explained above, to correct the conversion error $V_{err}$ by using a plurality of offset full-scale correction condensers $C_j$ (j=1–n), a voltage change ($V_{kj}-V_{0j}$) required for obtaining a desired voltage shift amount $\Delta V_{kin}$ is applied to $C_j$ during the k-th comparing period in accordance with the equations (10), (11).

As shown later in the third embodiment, a voltage change ($V_{kj}-V_{0j}$) required for obtaining a desired voltage shift amount $\Delta V_{kin}$ is selected from a plurality of terminals at a lower voltage side of the D/A conversion circuit per comparing period by use of a selector. However, the value of a voltage shift amount $\Delta V_{kin}$ is controlled by changing a capacitance coupling ratio which is a multiplying constant of each voltage change ($V_{kj}-V_{0j}$) in the equation (10).

In FIG. 4, switches $SW_{01}, SW_{02}, \ldots SW_{0n}$ are provided to selectively connect the offset full-scale correction condensers $C_1$ to $C_n$, to $C_{SH}$, to thereby enlarge the correction range of the conversion error $V_{err}$ and to perform the correction more accurately.

As described, if a circuit is arranged so as to select a plurality of capacitance coupling ratios, it is possible to suppress enlargement of a circuit scale due to increase of correction condensers in number.

Furthermore, when the offset correction is performed simultaneously in the second embodiment, a voltage shift amount for correcting a D/A conversion voltage $V_{dac}$ may be obtained by adding $C_{off}$ to one of $C_i$ and $C_j$ and by adding ($V_{off1}-V_{off2}$) to ($V_{ki}-V_{0i}$) in the equation (10). When the conversion error $V_{err}$ is corrected by using the aforementioned method, a process for optimizing a correction amount in accordance with the parasitic resistance of the A/D converter circuit.

Now, referring to FIGS. 5 to 7, a third embodiment of the present invention will be explained. In the third embodiment, a circuit arrangement for performing the offset correction and the offset full-scale correction shown in the first and second embodiments will be explained more specifically.

Figure 5:
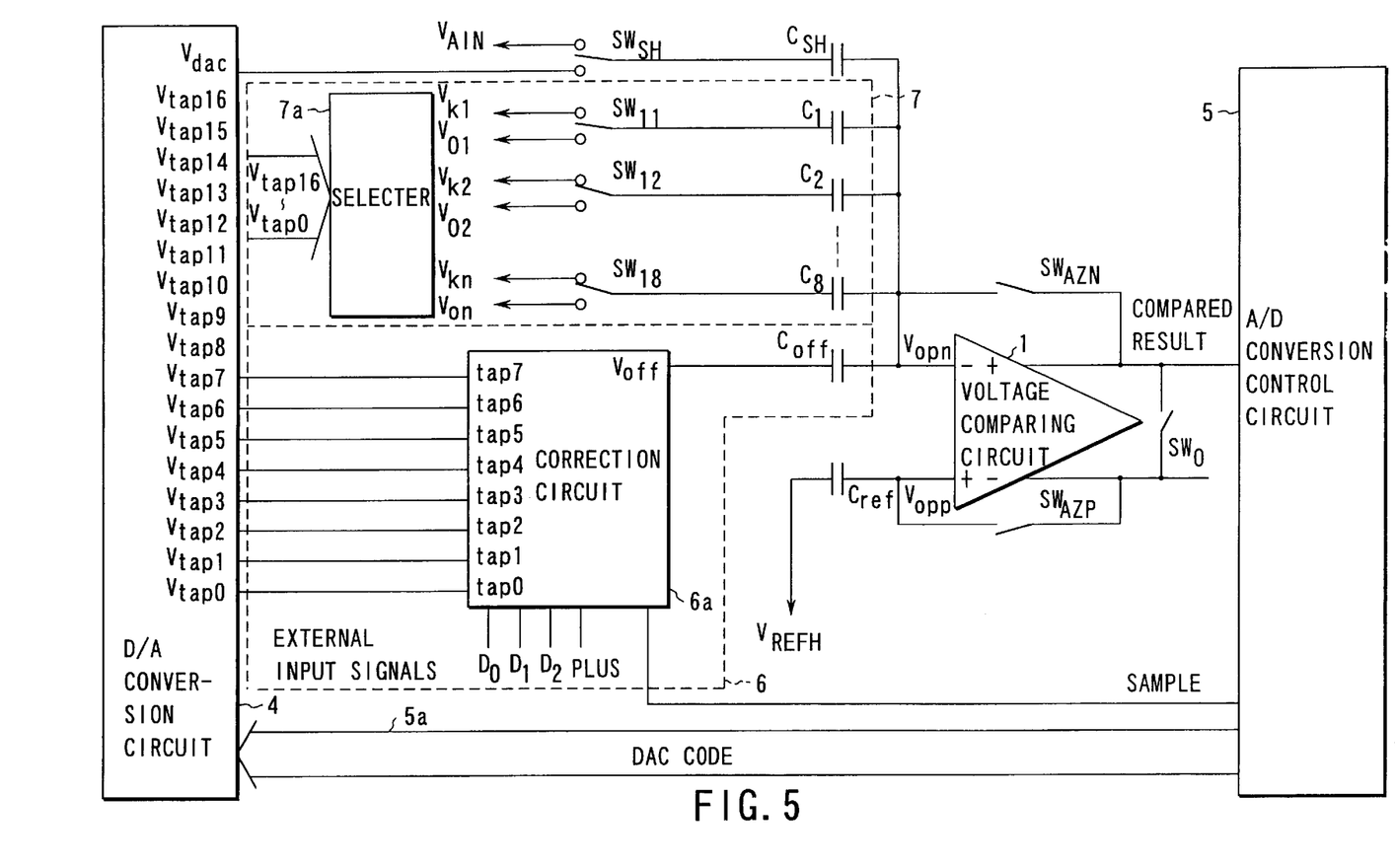
FIG. 5 is a circuit diagram showing an arrangement of the successive approximation A/D converter circuit according to a third embodiment.

FIG. 5 shows a circuit arrangement of the successive approximation A/D converter circuit according to the third embodiment. The successive approximation A/D converter circuit comprises a voltage comparing circuit 1, a D/A conversion circuit 4, a A/D conversion control circuit 5, a first level shift circuit 6 including a correction circuit 6a, and a second level shift circuit 7 including a selector 7a. The successive approximation A/D converter circuit is integrated on a semiconductor integrated circuit.

The D/A conversion circuit 4 outputs a D/A conversion voltage $V_{dac}$ obtained from the D/A conversion code and D/A conversion voltages $V_{tap0}-V_{tap16}$ in accordance with D/A conversion codes from "0H" to "10H".

The correction circuit 6a included in the first lever shift circuit 6 selects the D/A conversion voltages $V_{tap0}-V_{tap7}$ output from the D/A conversion circuit 4 in accordance with external signals $D_0, D_1, D_2$, PLUS, and SAMPLE which is a signal from the A/D converter circuit, and outputs a voltage $V_{off}$ to be used in the offset correction.

The output voltage $V_{off}$ of the correction circuit 6a is controlled to be $V_{off1}$ in the sampling period and $V_{off2}$ in the comparing period. When the difference in voltage between both values is applied to the offset correction condenser $C_{off}$ included in the first level shift circuit 6, the offset correction can be made evenly (equally) independent of a type of A/D conversion code.

In the second level shift circuit 7 performing the offset full-scale correction, $V_{tap8}$ is selected as the voltage output from the selector 7a during the sampling period and the MSB conversion period. Hereinafter, the selector 7a is controlled so as to select a plurality of voltages $V_{k1}$ to $V_{k8}$ from the D/A conversion voltages $V_{tap0}$ to $V_{tap16}$ by the combination of the D/A conversion codes to be compared in a k-th time. The voltage comparing circuit 1 compares the D/A conversion voltage $V_{dac}$ with the analog input voltage $V_{AIN}$ by using the offset correction voltage $V_{off}$ and the offset full-scale correction voltages $V_{k1}$ to $V_{K8}$ selected by the selector.

The A/D conversion control circuit 5 repeats an operation for determining data corresponding to predetermined one-bit of the D/A conversion code in accordance with the comparison results of the voltage comparing circuit 1 per every bit from the MSB to LSB of the D/A conversion code, and the D/A conversion code (DAC code) is output to the D/A conversion circuit 4 as indicated by a thick arrow in the lower portion of FIG. 5. The D/A conversion code finally determined is held as the A/D conversion data.

Figure 6:
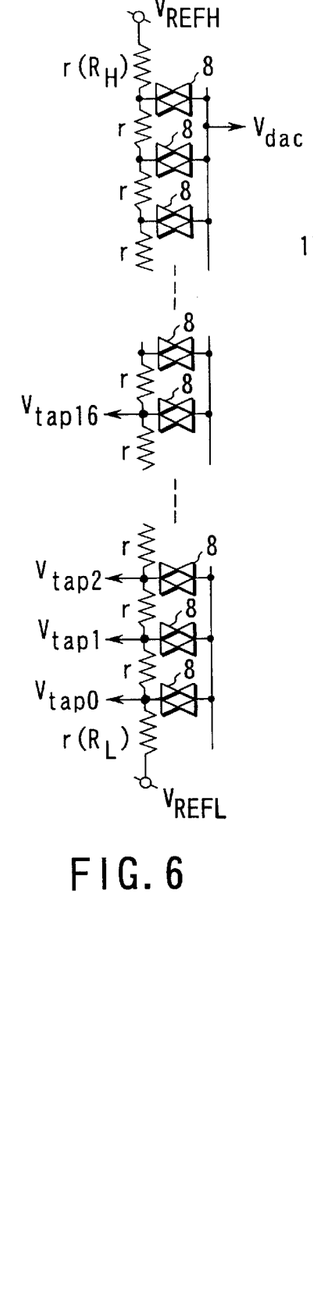
FIG. 6 is a circuit diagram showing an arrangement of the D/A conversion circuit according to a third embodiment.

FIG. 6 is a circuit arrangement of the D/A conversion circuit 4. In the D/A conversion circuit 4, a plurality of voltage dividing resistors of the resistance r ($2^{10}$ number of unit resistors in the case of 10-bit A/D converter circuit,) are connected in series between a first node (to which a high level reference voltage $V_{REFH}$ of the D/A conversion voltage $V_{dac}$ is applied) and a second node (to which a low level reference voltage $V_{REFL}$ is applied). However, since a parasitic resistance is included in the voltage dividing resistors placed at both ends, the resistance value r is not an actually used value but $R_H$, $R_L$ are used in practice.

One of the terminals of each of a plurality of switches 8 is connected to the corresponding voltage dividing node of the voltage dividing resistors, whereas the other terminal of each of the switches 8 is connected to a common output node of the D/A conversion voltage $V_{dac}$. In this way, the switches 8 are turned on selectively in accordance with the D/A conversion code. Furthermore, 16 voltage dividing nodes at the $V_{REFL}$ side are connected to the corresponding output nodes $V_{tap0}-V_{tap16}$ of the D/V conversion circuit 4, respectively.

Figure 7:
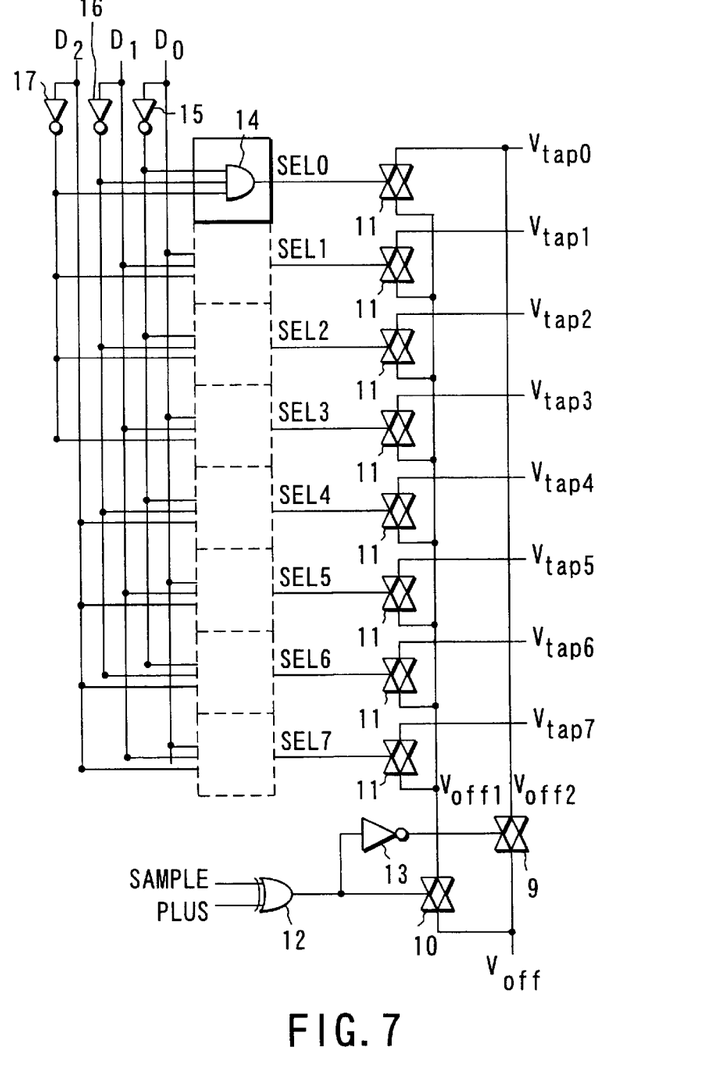
FIG. 7 shown a circuit diagram showing an example of a correction circuit included in a first level-shift circuit according to the third embodiment.

FIG. 7 shows a circuit arrangement of the correction circuit 6a shown in FIG. 5. The correction circuit of FIG. 7 comprises switches 9, 10 for selecting either a voltage $V_{off1}$ or $V_{off2}$ for use in offset correction, a plurality of switches 11 for selecting one of the output nodes $V_{tap0}$ to $V_{tap7}$ of the D/A conversion circuit, a control circuit consisting of an EXCLUSIVE OR gate 12, and an inverter 13 for controlling operations of the switches 9, 10 by using signals SAMPLES and PLUS which show a high level (hereinafter referred to as "H") exclusively during the sampling period, and a selector circuit for selectively operating one of the switches 11 by use of SEL0 to SEL7 of 3 input AND gate 14 to which external signals $D_0, D_1, D_2$ and output from the inverters 15–17 are connected. The output from the correction circuit is connected to the output terminal $V_{off}$.

Now, we will explain an operation for outputting $V_{off1}$, $V_{off2}$ to the output terminal $V_{off}$ of the correction circuit by using signals, SAMPLE and PLUS. The switches 9, 10 have a control gate which is turned on or off in accordance with + or − of the signals to be applied to the control gate in the same manner as in the switch 11.

Since the signal SAMPLE is in the state of "H" during the sampling period, if the signal PLUS is in the state of "H", the output from the EXCLUSIVE OR gate 12 is in the state of a low level (hereinafter referred as "L"). It follows that the control gates of the switches 9, 10 become "H" and "L" through the inverter 13, so that the switches 9 and 10 are respectively turned on and off, and therefore, $V_{off2}$ is output from the correction circuit.

If the signal PLUS is "L" during the sampling period, the switches 9 and 10 are turned off and on in the same manner as described above, $v_{off1}$ is output from the correction circuit.

In the comparing period, since the signal SAMPLE is "L", if the signal PLUS is "H", output from the EXCLUSIVE OR gate 12 is "H" and therefore, the control gates of the switches 9 and 10 are respectively turned on and off through the inverter 13. As a result, $V_{off1}$ is output from the correction circuit.

In the comparing period, if the signal PLUS is "L", the switches 9 and 10 are respectively turned on and off. As a result, $V_{off2}$ is output from the correction circuit.

Accordingly, if the sampling period is exchanged with the comparing period while the signal PLUS is maintained in "H", $V_{off2}$ and $V_{off1}$ are output from the correction circuit respectively in the sampling period and the comparing period. On the other hand, if the sampling period is exchanged with the comparing period while the signal PLUS is maintained in "L", $V_{off1}$ and $V_{off2}$ are output from the correction circuit respectively in the sampling period and the comparing period.

More specifically, it is possible to perform offset corrections in opposite directions to each other in the overall conversion error characteristics shown in FIG. 1 by setting the signal PLUS at "H" or "L". In this manner, it is easy to perform a level shift in two-way directions by using one of input terminals of the voltage comparing circuit 1 shown in FIG. 4.

Figure 8:
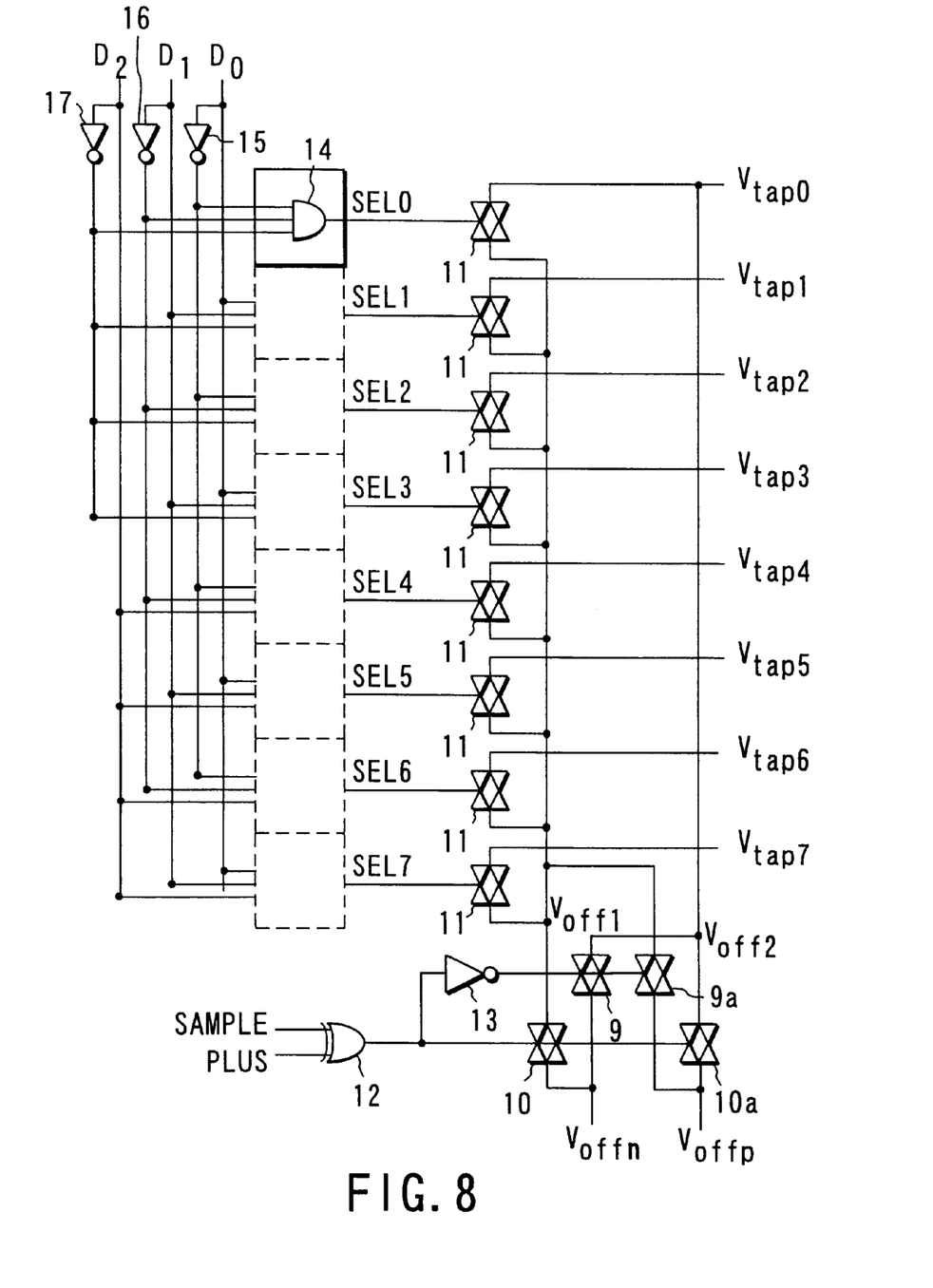
FIG. 8 is a circuit diagram showing a modified example of the correction circuit included in the first level shift circuit according to the third embodiment.

FIG. 8 is a modified example of the correction circuit shown in FIG. 7. The correction circuit of FIG. 8 has differential output terminals $V_{offn}$ and $V_{offp}$. The differential output terminals are respectively connected to input-side terminals of the offset correction condensers $C_{off}$, $C_{offp}$ which are connected to (−) terminal and (+) terminal of FIG. 4.

In the correction circuit of FIG. 8, switches 9, 9a and switches 10, 10a are controlled in couple. Offset correction voltages $V_{off1}$, $V_{off2}$ selected from tap0 to tap7 are output to the differential output terminals $V_{offn}$, $V_{offp}$, respectively.

In the sampling period, since the signal SAMPLE is "H", if the signal PLUS is "H", then, output of the EXCLUSIVE OR gate 12 is "L". Therefore, the control gates of switches 9, 9a and 10, 10a become "H" through the inverter 13. It follows that the switches 9, 9a and 10, 10a are turned on and off, respectively, and the output terminal $V_{offn}$ of the correction circuit is equal to $V_{off2}$, the output terminal $V_{offp}$ is equal to $V_{off1}$.

In the sample period, if the signal PLUS is "L", then, the switches 9, 9a and 10, 10a are turned off and on, respectively, and the output terminal $V_{offn}$ of the correction circuit is equal to $V_{off1}$ and the output terminal $V_{offp}$ is equal to $V_{off2}$.

In the comparing period, since the signal SAMPLE is L", if the signal PLUS is "H", the switches 9, 9a and 10, 10a are turned off and on, respectively. It follows that the output terminal $V_{offn}$ of the correction circuit is $V_{off1}$ and the output terminal $V_{offp}$ is $V_{off2}$.

Furthermore, in the comparing period, if the signal PLUS is "L", the switches 9, 9a and 10, 10a are turned on and off, respectively. It follows that the output terminal $V_{offn}$ of the correction circuit is $V_{off2}$ and the output terminal $V_{offp}$ is $V_{off1}$.

Accordingly, if the sampling period is exchanged with the comparing period while the signal PLUS is maintained "H", $V_{off2}$, $V_{off1}$ in the sampling period, $Voff_1$, $V_{off2}$ in the comparing period are output to the output terminals $V_{offn}$, $V_{offp}$ of the correction circuit.

On the other hand, if the sampling period and the comparing period are exchanged with each other while the signal PLUS is maintained in "L", $V_{off1}$, $V_{off2}$ in the sampling period, $V_{off2}$, $V_{off1}$, in the comparing period are output to the output terminals $V_{offn}$, $V_{offp}$ of the correction circuit.

More specifically, it is possible to perform offset corrections to the differential circuit arrangement in opposite directions by setting the signal PLUS at "H" or "L". In this manner, it is easy to perform a level shift in two-way directions by using a differential input terminal of the voltage comparing circuit 1 shown in FIG. 4.

Then, we will explain amount of correction of $V_{err}$ by the first and second level shift circuits explained in the third embodiment. As described previously, in the third embodiment, since a voltage for offset correction is selected from $V_{tap0}$ to $V_{tap7}$ of the D/A conversion circuit 4, at most ±7LSB voltage difference $V_{off1}-V_{off2}$ can be given between the sampling period and comparing period by the signal SAMPLE from the A/D converter circuit, external input signals $D_0$, $D_1$, $D_2$, and PlUS.

In the correction circuit arrangement according to the third embodiment, if $C_{SH}$:$C_1$:$C_2$:$C_3$:$C_4$:$C_5$:$C_6$:$C_7$:$C_8$:$C_{off}$= 56:1:1:1:1:1:1:1:8 in a capacitance ratio, the maximum correction amount $\Delta V_{offmax}$ of the circuit threshold value to be added to the voltage comparing circuit in the offset correction is ±7/8LSB since the capacitance coupling ratio:

$$K_{off=Coff}/(C_{SH}+C_1+C_2+C_3+C_4+C_5+C_6+C_7+C_8)=1/8.$$

To allow the A/D conversion code to be consistent with a theoretical value in the case of $V_{AIN}$=($V_{REFH}$−$V_{REFL}$)/2, a combination of $K_{off}$ and $\Delta V_{off}$ may be set in such a way that $K_{off} \cdot \Delta V_{off}$ is equal to a practically obtained $V_{err}$ value (satisfying $V_{AIN}$=($V_{REFH}$−$V_{REFL}$)/2).

In the third embodiment, to improve the offset full-scale error, it is necessary to apply a potential $V_{tap8}$ to $C_1$ to $C_8$ until MSB is determined. Table 1 shows the relationship between the tap number selected in the successive approximation process and the corresponding correction amount $\Delta V_{kin}$ in the case where 10 bit A/D converter circuit is used and the analogous input voltage $V_{AIN}$ is "153H" in terms of the A/D conversion code. In this case, the condenser capacitance ratio is the same as mentioned above.

TABLE 1

| D/A CONVERSION CODE | CORRECTION $\Delta V_{kin}$ | \multicolumn{8}{c}{SELECTED TAP NUMBER} |
|---|---|---|---|---|---|---|---|---|---|
| | | C1 | C2 | C3 | C4 | C5 | C6 | C7 | C8 |
| 200H* | 0 | 8 | 8 | 8 | 8 | 8 | 8 | 8 | 8 |
| 180H | 1/2 | 4 | 4 | 4 | 4 | 4 | 4 | 4 | 4 |
| 140H | 3/4 | 2 | 2 | 2 | 2 | 2 | 2 | 2 | 2 |
| 160H | 5/8 | 3 | 3 | 3 | 3 | 3 | 3 | 3 | 3 |
| 150H | 11/16 | 3 | 3 | 3 | 3 | 2 | 2 | 2 | 2 |
| 158H | 21/32 | 3 | 3 | 3 | 3 | 3 | 3 | 2 | 2 |
| 154H | 43/64 | 3 | 3 | 3 | 3 | 3 | 2 | 2 | 2 |

*CONDITION IN COMPARING MSB

From the result of Table 1, if the minimum value of the correction amount $\Delta V_{kin}$ is $V_{kinmin}$, in the third embodiment, it is found that correction can be made with a minimum resolution of $\Delta V_{kinmin}$=±1/64LSB. If the maximum value of the correction amount $\Delta V_{kin}$ is $V_{kinmax}$, it is found that correction can be made with a maximum resolution to $\Delta V_{kinmax}=\pm 1$LSB (corresponding to the correction amount $\Delta V_{kin}$ when all selected tap numbers are set at 0 in Table 1). Therefore, the correction of the offset full-scale error can be made to 2LSB.

In the third embodiment, since the capacitance ratios of $C_1$ to $C_8$ are equal, the tap number of the voltage to be applied to a capacitor in a selector operation may be the same until first 4 bits are determined. In other words, the selector circuit arrangement satisfying the operation conditions is the simplest and the most practical.

The present invention is not limited to the aforementioned embodiments. In the third embodiment, the offset correction is explained in which the offset correction condenser $c_{off}$ is connected to each of the differential input terminals of the voltage comparing circuit 1 by using the correction circuit 6a included in the first level shift circuit 6 as the differential output, and the output terminal of the differential correction circuit is connected to the input terminals. Similarly, the offset full-scale correction can be made by the same differential circuit arrangement, if $C_1$ to $C_8$ are connected to the differential input terminals of the voltage comparing circuit 1, respectively and the second level shift circuit 7 is arranged in the differential circuit manner. Besides this, various modifications can be made within the gist of the present invention.

As mentioned above, according to the successive approximation A/D converter circuit, a change in reference voltage of the D/A conversion circuit due to parasitic resistance can be corrected by use of a plurality of voltages from the first level shift circuit, the second level shift circuit, and the D/A conversion circuit.

Even if the D/A conversion circuit includes the offset error due to parasitic resistance, and a conversion error (rising rightward), correction can be made in such a manner that it appears virtually equal to an ideal D/A conversion circuit by applying a plurality of voltages to the voltage comparing circuit. It is therefore possible to obtain an accurate A/D conversion code for the analogous input voltage.

In the first level shift circuit, the conversion voltage of the entire A/D conversion code can be shifted relatively by $+\Delta V$ (or $-\Delta V$) by applying different voltages to the offset correction condenser $C_{off}$ added during the sampling period and the comparing period. It is therefore possible to determine MSB of the A/D conversion code by performing such an offset correction. Simultaneously, the conversion errors to the A/D conversion code at a distance of $|\Delta V_{A/N}|$ from $(V_{REFH}+V_{REFL})/2$ can be set equal in absolute value. Hence, the circuit arrangement can be simplified for performing the offset full-scale correction required for the second level shift circuit.

In the second level shift circuit, a difference in voltage selected from the tap of the D/A conversion circuit is applied to the added offset full-scale correction condensers $C_1$ to $C_n$ in the successive comparing process for determining the A/D conversion code. In this manner, it is possible to eliminate the error (rising rightward) of the overall conversion error characteristics remaining after the offset correction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A successive approximation A/D converter circuit, comprising:

a resistor circuit comprised of a plurality of unit resistors connected in series;

a parasitic resistance being included in a unit resistor located at each of two ends of the resistor circuit;

a D/A conversion circuit for outputting a D/A converted voltage from a D/A conversion code and a plurality of voltages divided by the resistor circuit, by using first and second reference voltages applied to the two ends of the resistor circuit;

a voltage comparing circuit for comparing the D/A conversion voltage and an analogous input voltage;

data determining means for determining a predetermined data corresponding to one bit of the D/A conversion code in accordance with output from the voltage comparing circuit;

an A/D conversion control circuit for repeatedly applying the data determination means to each bit of the D/A conversion code from MSB to LSB and outputting the D/A conversion code finally determined to the D/A conversion circuit, and holding the D/A conversion code as an A/D conversion data;

a level shift circuit for shifting a comparing voltage of the voltage comparing circuit independently of the D/A conversion code by using a first voltage and a second voltage selected from the plurality of voltages, wherein the first voltage is a voltage of an intermediate terminal connected between the unit resistor at one end of the resistor circuit including the parasitic resistance and an adjacent unit resistor of the resistor circuit having no parasitic resistance, and the second voltage is a voltage of any one of intermediate terminals each connected between any two adjacent unit resistors of the resistor circuit having no parasitic resistance.

2. The successive approximation A/D converter circuit according to claim 1, wherein the level shift circuit comprises:

at least one of offset correction condensers; and voltage switching means for switching the first and second voltages between a sampling period and a comparing period and applying the first voltage or the second voltage to one of terminals of said at least one of offset correction condensers, the other terminal of said at least one of offset correction condensers being connected to one of input terminals of the voltage comparing circuit.

3. The successive approximation A/D converter circuit according to claim 1, wherein the level shift circuit comprises:

a first switch one of terminals to which the first voltage is applied;

a plurality of second switches one of terminals to which the second voltage is applied;

a common line to which the other terminals of the plurality of second switches are commonly connected;

a third switch one of terminals of which is connected to the common line;

an output node to which the other terminal of each of the first and third switches is connected;

at least one of offset correction condensers one of terminals of which is connected to the output node;

a first switching control means for selectively turning on one of the plurality of second switches; and a second switching control means for exclusively turning on or off the first and third switches by using a signal which exhibits a high level only in the sampling period, as one of signals, wherein other terminal of said at least one of offset correction condensers is connected to one of input terminals of the voltage comparing circuit, and the first and second voltages are switched between the sampling period and the comparing period by the first and second switching control means, and output to the output node, such that an offset correction level shift voltage is input into one of input terminals of the voltage comparing circuit through said at least one of offset correction condensers.

4. The successive approximation A/D converter circuit according to claim 1, wherein the level shift circuit comprises:

at least one of first offset correction condensers;

at least one of second offset correction condensers; and voltage switching means for switching the first and second voltages between the sampling period and the comparing period and applying the first and second voltages to one of terminals of each of the first and second offset correction condensers, wherein the other terminals of the first and second offset correction condensers are connected to two input terminals of the voltage comparing circuit, respectively.

5. The successive approximation A/D converter circuit according to claim 1, wherein the level shift circuit comprises:

a first switch one of terminals to which the first voltage is applied;

a plurality of second switches one of terminals to which the second voltage is applied;

a common line to which the other terminals of the plurality of second switches are commonly connected;

a third switch one of terminals of which is connected to the common line;

a fourth switch one of terminals of which is connected to the common line;

a fifth switch one of terminals to which the first voltage is applied;

a first output node to which the other terminals of the first and fourth switches are connected;

at least one of first offset correction condensers one of terminals of which is connected to the first output node;

a second output node to which the other terminals of the third and fifth switches are connected;

at least one of second offset correction condensers one of terminals of which is connected to the second output node;

a first switching control means for selectively turning on one of the plurality of second switches; and a second switching control means for exclusively turning on or off the first and fourth switches and third and fifth switches by using a signal which exhibits a high level only in the sampling period, as one of signals, wherein the other terminal of said at least one of first offset correction condensers is connected to one of input terminals of the voltage comparing circuit, the other terminal of said at least one of second offset correction condensers is connected to the other input terminal of the voltage comparing circuit, and the first and second voltages are switched between the sampling period and the comparing period by the first and second switching control means, and output to the first and second output nodes, such that offset correction level shift voltages are input into one of input terminals of the voltage comparing circuit through said at least one of first and second offset correction condensers.

6. A successive approximation A/D converter circuit comprising:

a resistor circuit consisting of a plurality of unit resistances connected in series;

a D/A conversion circuit for outputting a D/A converted voltage from a D/A conversion code and a plurality of voltages divided by the resistor circuit, by using first and second reference voltages applied to two ends of the resistor circuit;

data determining means for determining a predetermined data corresponding to a bit of the D/A conversion code in accordance with output of the voltage comparing circuit;

an A/D conversion control circuit for repeatedly applying the data determination means to each bit of the D/A conversion code from MSB to LSB and outputting the D/A conversion code finally determined to the D/A conversion circuit, and holding the D/A conversion code as A/D conversion data;

a first level shift circuit for shifting a comparing voltage of the voltage comparing circuit by using first and second voltages selected from the plurality of voltages independently of the D/A conversion code; and a second level shift circuit for selecting a plurality of third voltages in accordance with the D/A conversion code from the plurality of voltages and selecting a plurality of fourth voltages in couple with the plurality of third voltages, and shifting a comparing voltage of the voltage comparing circuit in accordance with the D/A conversion code by using the plurality of third and fourth voltages.

7. The successive approximation A/D converter circuit according to claim 6, wherein the first level shift circuit comprises at least one of offset correction condensers; and voltage switching means for switching first and second voltages between a sampling period and a comparing period and applying the first voltage or the second voltage to one of terminals of said at least one of offset correction condensers, the other terminal of said at least one of offset correction condensers being connected to one of input terminals of the voltage comparing circuit.

8. The successive approximation A/D converter circuit according to claim 6, wherein the first level shift circuit comprises:

a first switch one of terminals of which is connected to an intermediate terminal of an end of the resistance circuit;

a plurality of second switches connected to the corresponding intermediate terminals of the resistance circuit by way of one of terminals of each of the second switches;

a common line to which the other terminals of the plurality of second switches are commonly connected;

a third switch one of terminals of which is connected the common line;

an output node to which the other terminal of each of the first and third switches is connected;

at least one of offset correction condensers to which one of terminals of the output node is connected;

first switching control means for selectively turning on one of the plurality of second switches; and a second switching control means for exclusively turning on or off the first and third switches by using a signal which exhibits a high level only in the sample period, as one of signals, wherein other terminal of said at least one of offset correction condensers being connected to one of input terminals of the voltage comparing circuit; and a voltage of the intermediate terminal of an end of the resistance circuit (designated as a first voltage) and a voltage of any one of intermediate terminals (designated as a second voltage) are switched between the sampling period and the comparing period by the first and second switching control means, and output to the output node, whereby an offset correction level shift voltage is input into one of input terminals of the voltage comparing circuit through said at least one of offset correction condensers.

9. The successive approximation A/D converter circuit according to claim 6, wherein the first level shift circuit comprises:

at least one of first offset correction condensers;

at least one of second offset correction condensers; and voltage switching means for switching first and second voltages between the sampling period and the comparing period and applying the first and second voltage to one of terminals of each of the first and second offset correction condensers, the other terminals of the first and second offset correction condensers being connected to two input terminals of the voltage comparing circuit, respectively.

10. The successive approximation A/D converter circuit according to claim 6, wherein the first level shift circuit comprises:

a first switch one of terminals of which is connected to an intermediate terminal of an end terminal of the resistance circuit;

a plurality of second switches connected to the corresponding intermediate terminals of the resistance circuit by way of one of terminals of each of the second switches;

a common line to which the other terminals of the plurality of second switches are commonly connected;

a third switch one of terminals of which is connected the common line;

a fourth switch one of terminals of which is connected to the common line;

a fifth switch one of terminals of which is connected to the intermediate terminal of an end of the resistance circuit;

a first output node to which the other terminals of the first and fourth switches are connected;

at least one of first offset correction condensers one of terminals of which is connected to the first output node;

a second output node to which the other terminals of the third and fifth switches are connected;

at least one of second offset correction condensers connected to the second output node by way of one of the terminals of the second offset correction condensers;

a first switching control means for selectively turning on one of the plurality of second switches; and a second switching control means for exclusively turning on or off the first and fourth switches and third and fifth switches by using a signal which exhibits a high level only in the sample period, as one of signals, wherein the other terminal of said at least one of first offset correction condensers is connected to one of input terminals of the voltage comparing circuit;

the other terminal of said at least one of second offset correction condensers is connected to the other input terminal of the voltage comparing circuit;

a voltage of the intermediate terminal of an end of the resistance circuit (designated as a first voltage) and a voltage of any one of intermediate terminals (designated as a second voltage) are switched between the sampling period and the comparing period by the first and second switching control means, and output to the first and second output nodes, whereby offset correction level shift voltages are input into one of input terminals of the voltage comparing circuit through said at least one of first and second offset correction condensers.

11. The successive approximation A/D converter circuit according to claim 6, wherein the second level shift circuit comprises:

a plurality of offset full-scale correction condensers; and voltage switching means for switching a plurality of third and fourth voltages both being coupled with each other between the sampling period and the comparing period and applying one of the plurality of third and fourth voltages to the corresponding offset full-scale correction condensers through one of terminals thereof, wherein the other terminals of the plurality of offset full-scale correction condensers are commonly connected to one of input terminals of the comparing circuit.

12. The successive approximation A/D converter circuit according to claim 6, wherein the second level shift circuit comprises:

a selector for selecting a plurality of first intermediate terminals and a plurality of intermediate terminals coupled with the plurality of first intermediate terminals in accordance with the D/A conversion code from the plurality of intermediate terminals of the resistance circuit;

a plurality of three-terminal switches two input terminals of which are connected to a plurality of first and second intermediate terminals; and a plurality of offset full-scale correction condensers connected to the corresponding output terminals of the plurality of three-terminal switches, wherein the three terminal switch switches voltages of the two input terminals between the sampling period and the comparing period, and applies the voltages to one of terminals of the offset full-scale correction condensers.

* * * * *